United States Patent
Han et al.

(10) Patent No.: US 10,995,652 B1
(45) Date of Patent: May 4, 2021

(54) CIRCUIT INTEGRATED TYPE COOLANT THERMOELECTRIC GENERATION SYSTEM AND COOLANT CONTROL THERMOELECTRIC GENERATION METHOD

(71) Applicants: Hyundai Motor Company, Seoul (KR); Kia Motors Corporation, Seoul (KR)

(72) Inventors: Jung-Jae Han, Incheon (KR); Joon-Woo Kim, Seoul (KR); Sang-Joon Park, Yongin-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/815,292

(22) Filed: Mar. 11, 2020

(30) Foreign Application Priority Data

Dec. 10, 2019 (KR) .................. 10-2019-0163822

(51) Int. Cl.
*F01P 7/16* (2006.01)
*F01P 7/12* (2006.01)
*H01L 35/00* (2006.01)
*F01P 7/14* (2006.01)

(52) U.S. Cl.
CPC .............. *F01P 7/165* (2013.01); *H01L 35/00* (2013.01); *F01P 2007/146* (2013.01)

(58) Field of Classification Search
CPC ........... F01P 2007/146; F01P 7/16; F01P 7/12
See application file for complete search history.

(56) References Cited

U.S. PATENT DOCUMENTS

| 2004/0098174 A1* | 5/2004 | Suda | F01P 7/167 700/299 |
| 2004/0107922 A1* | 6/2004 | Roth | F01P 7/167 123/41.1 |
| 2005/0001044 A1* | 1/2005 | Masuko | F16K 11/02 236/101 R |

(Continued)

FOREIGN PATENT DOCUMENTS

EP    1 679 480 A1    7/2006

*Primary Examiner* — Long T Tran
(74) *Attorney, Agent, or Firm* — Morgan, Lewis & Bockius LLP

(57) ABSTRACT

A coolant thermoelectric generation system may include a thermoelectric module 20 connected to a high temperature line 13 through which engine coolant flows and a low temperature line 24 through which coolant having a temperature lower than a temperature of the engine coolant flows, and configured to perform thermoelectric generation with a heat exchange effect based on a coolant temperature difference between the engine coolant and the coolant having a temperature lower than a temperature of the engine coolant with a thermoelectric element 21 interposed therebetween; a heat exchange line 16, in which the heat exchange effect occurs, and a bypass line 17, in which no heat exchange effect occurs, the heat exchange line and the bypass line connected to the high temperature line to form two paths, respectively 13; and built-in valves 14, 14-1, 14-2 located in the internal space of the thermoelectric module, and configured to adjust flow rates of the coolant in the heat exchange line and the bypass line.

19 Claims, 10 Drawing Sheets

(56) References Cited

U.S. PATENT DOCUMENTS

| | | | | |
|---|---|---|---|---|
| 2008/0115747 | A1* | 5/2008 | Snyder | F01P 3/20 |
| | | | | 123/41.31 |
| 2014/0069522 | A1* | 3/2014 | Kuze | F01P 7/14 |
| | | | | 137/334 |
| 2014/0165596 | A1* | 6/2014 | Freese | B60H 1/00478 |
| | | | | 62/3.2 |
| 2014/0196674 | A1* | 7/2014 | Quix | F01P 3/02 |
| | | | | 123/41.09 |
| 2015/0027386 | A1* | 1/2015 | Lewis | F01P 7/16 |
| | | | | 123/41.1 |

* cited by examiner

FIG.3
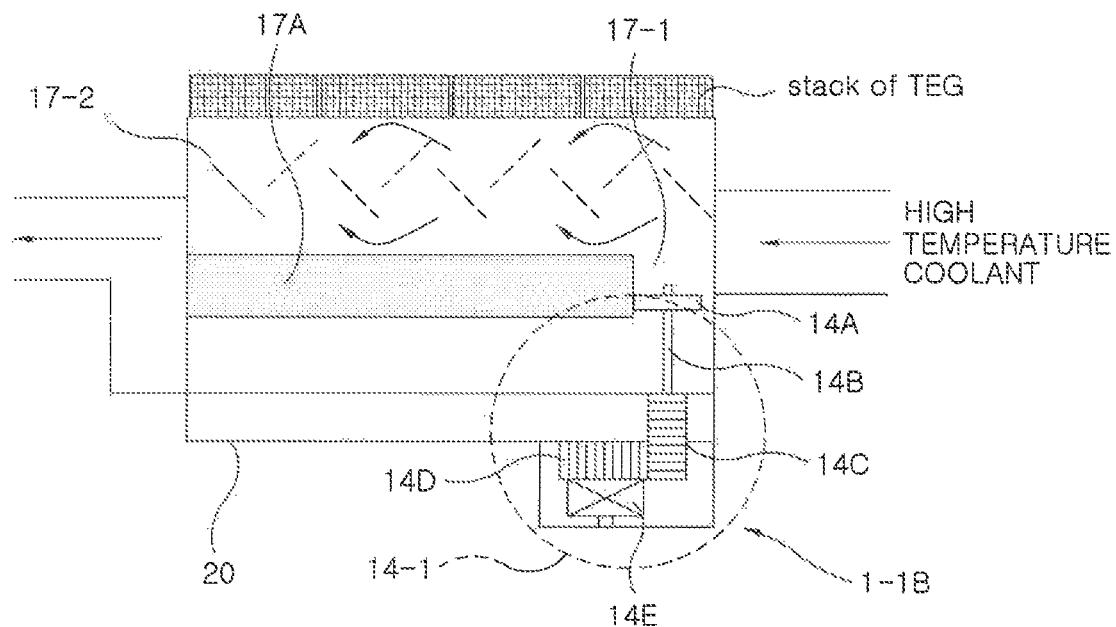
< THERMOELECTRIC MODULE CONTROL VALVE Closed >
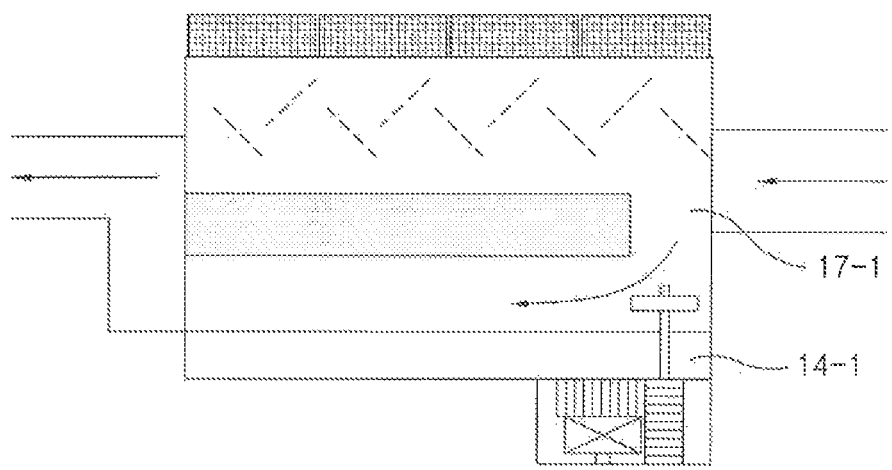
< THERMOELECTRIC MODULE CONTROL VALVE Opened >

FIG.4
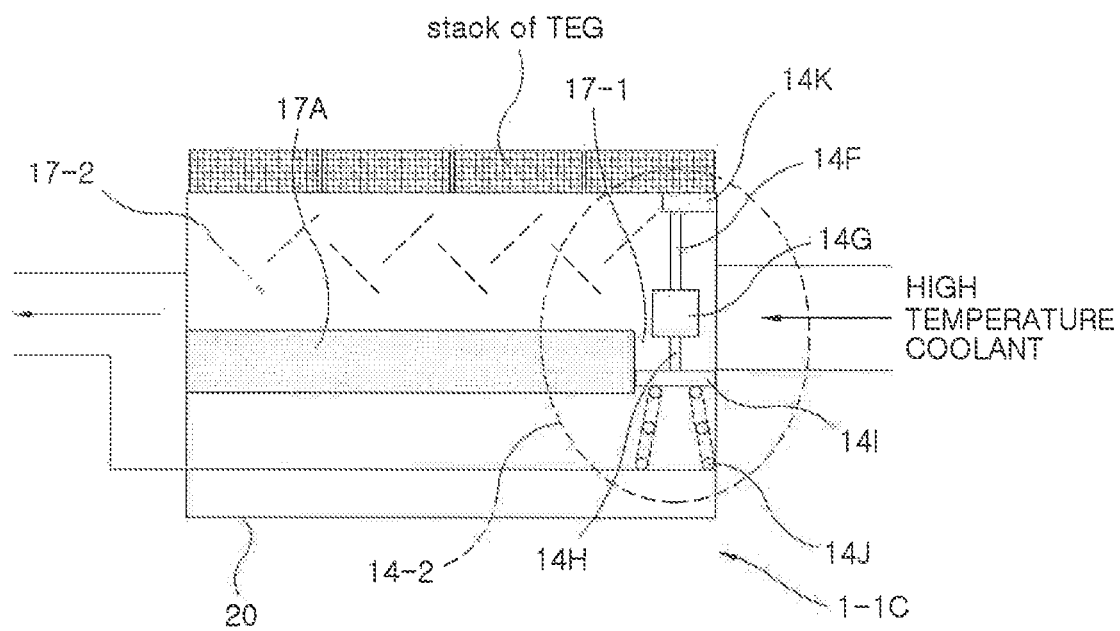
< BYPASS PASSAGE CLOSED, WAX DEFLATION >
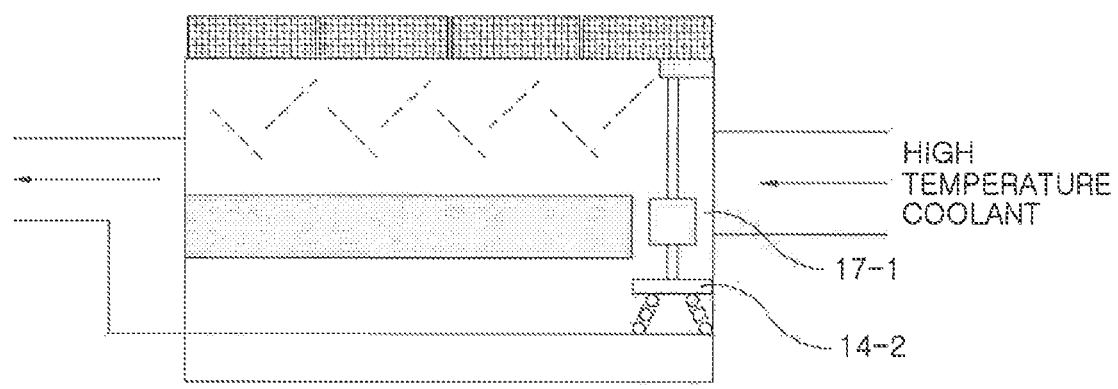
< BYPASS PASSAGE OPENED, WAX INFLATION >

FIG.7
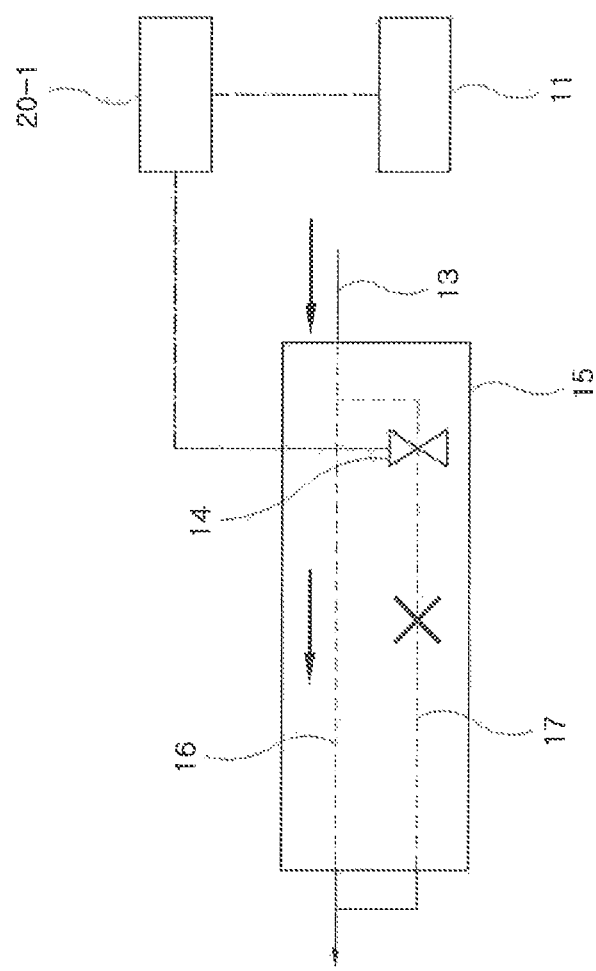
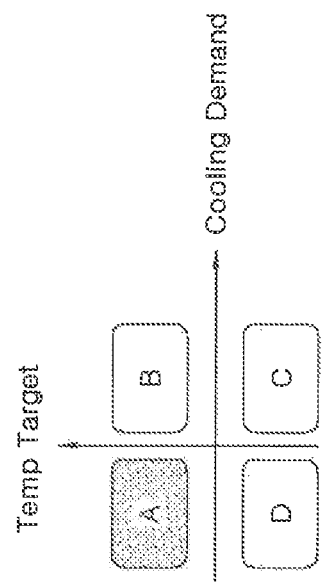

FIG.8
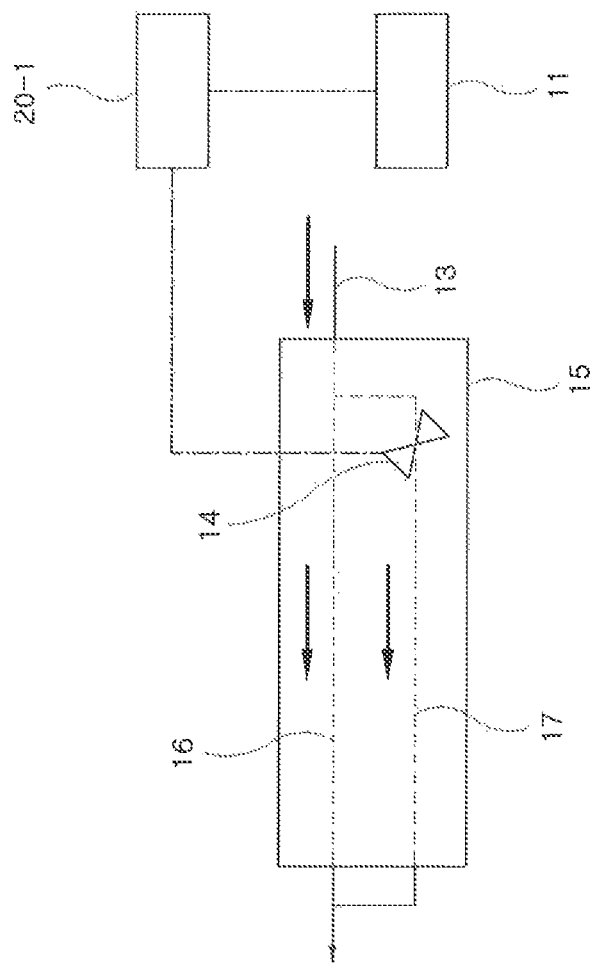
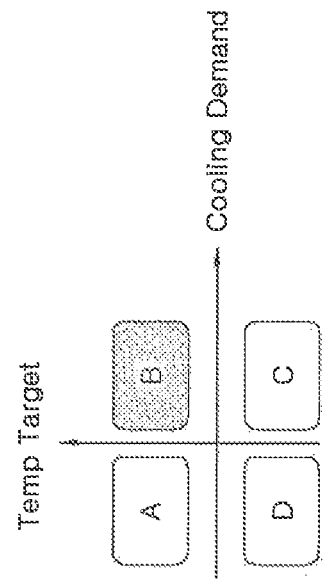

FIG.10
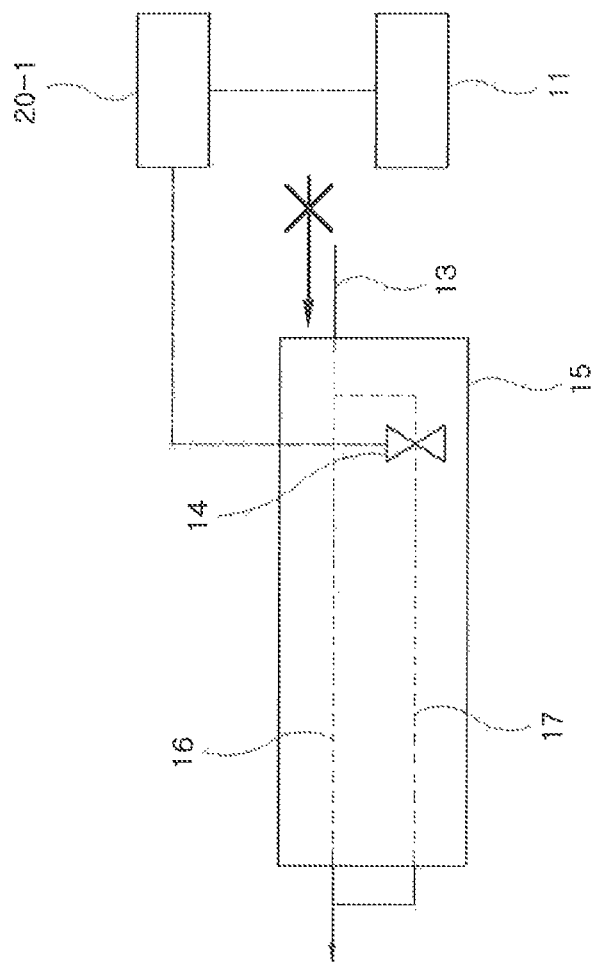
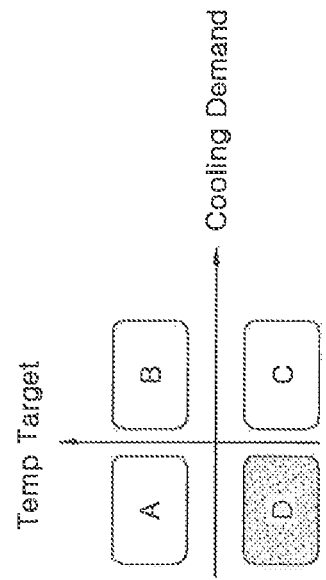

CIRCUIT INTEGRATED TYPE COOLANT THERMOELECTRIC GENERATION SYSTEM AND COOLANT CONTROL THERMOELECTRIC GENERATION METHOD

CROSS-REFERENCE TO RELATED APPLICATION

The present application claims priority to Korean Patent Application No. 10-2019-0163822, filed on Dec. 10, 2019, the entire contents of which is incorporated herein for all purposes by this reference.

BACKGROUND OF THE PRESENT INVENTION

Field of the Invention

The present invention relates to a coolant thermoelectric generation system, and to a coolant control thermoelectric generation method which implements simple coolant flow path control logic by use of a circuit integrated type coolant thermoelectric generation system having a simplified cooling circuit structure by reducing the number of flow path control valves.

Description of Related Art

In general, a coolant thermoelectric generation system for a vehicle generates electricity for battery charging or required by electronics by the heat exchange principle of the high temperature coolant circulating an engine.

For example, the coolant thermoelectric generation system forms a cooling circuit of an engine system as a primary cooling circuit and a secondary cooling circuit, and includes a plurality of flow path control valves mounted to the primary and secondary cooling circuits and connected to a valve controller configured for forming a circulation path between high temperature coolant and low temperature coolant. In the instant case, the plurality of flow path control valves include a Flow Rate Adjustment Valve (FRAV) for adjusting the coolant flow rate, a pair of Switching Valves (SV) for adjusting the coolant flow direction thereof, and a Thermostat for adjusting the coolant temperature.

Therefore, in a case where the opening and closing of the coolant thermoelectric generation system is controlled by the thermoelectric generation control logic of the valve controller, the coolant thermoelectric generation system circulates, when the high temperature coolant of the engine circulates to any one cooling circuit (for example, primary cooling circuit) of the primary cooling circuit and the secondary cooling circuit, the low temperature coolant having a temperature difference to another cooling circuit (for example, secondary cooling circuit), by use of the electricity, generated from a heat exchange principle based on the temperature difference between the high and low temperature coolants inside a thermoelectric module, for the battery charging or to supply it to the electronics (for example, a controller, a heater, a lamp, and the like) as power to be consumed.

However, the coolant thermoelectric generation system has the following problems.

Firstly, the cooling circuit branch layout makes it difficult to simplify the cooling circuit because one cooling circuit (for example, a primary cooling circuit) of two cooling circuits is connected to an engine and the thermoelectric module (that is, thermoelectric generator) is disposed to the other one (for example, a secondary cooling circuit). Secondly, it is difficult to reduce the number of flow path control valves (for example, FRAV, SV, thermostat) because the high temperature coolant flow path of the primary cooling circuit and the low temperature coolant flow path of the secondary cooling circuit, which are connected to the thermoelectric generator are individually controlled by the valve.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a circuit integrated type coolant thermoelectric generation system and a coolant control thermoelectric generation method, which may improve and optimize the system complexity by simplifying the layout of a cooling circuit in which engine coolant and low temperature coolant are circulated, and may also reduce an installation space required for a circuit configuration while performing a simple flow rate control for a high temperature coolant circuit with the reduction in the number of flow path control valves mounted.

A coolant thermoelectric generation system according to an exemplary embodiment of the present invention for achieving the object includes: a thermoelectric module connected to a high temperature line through which engine coolant flows and a low temperature line through which a coolant having a temperature lower than a temperature of the engine coolant flows, and configured to perform thermoelectric generation with a heat exchange effect based on a coolant temperature difference between the engine coolant and the low temperature coolant with a thermoelectric element interposed between the high temperature line and the low temperature line; and built-in valves integrated in an internal space of the thermoelectric module and configured to classify the high temperature line into a heat exchange line where the heat exchange effect occurs and a bypass line where no heat exchange effect occurs, and to perform path switching to the heat exchange line and the bypass line.

As an exemplary embodiment of the present invention, the built-in valve is configured to apply a bypass line flow path opening and closing rate to the bypass line so that amount of engine coolant flow rate in which the amount is smaller than a predetermined amount flows into the heat exchange line when the heat exchange line is closed by opening the bypass line.

As an exemplary embodiment of the present invention, the bypass line and the heat exchange line are branched in the internal space of the thermoelectric module, and the branched site is located with the built-in valve.

As an exemplary embodiment of the present invention, the built-in valve is a flow path switching valve, and the flow path switching valve performs the path switching in any one of a thermoelectric generation operation mode A, a thermoelectric generation operation mode B, a thermoelectric generation operation mode C, and a thermoelectric generation operation mode D.

As an exemplary embodiment of the present invention, an engine cooling demand amount and an engine coolant temperature target value are applied for classifying the thermoelectric generation operation modes A, B, C, and D. The thermoelectric generation operation mode A is a thermoelectric generation region, the thermoelectric generation operation mode B is a thermoelectric generation/engine cooling combined region, the thermoelectric generation operation mode C is an engine cooling region, and the thermoelectric generation operation mode D is a thermoelectric generation/engine cooling blocking region.

As an exemplary embodiment of the present invention, the built-in valve is a motor valve, and the motor valve performs the path switching with a screw rotation by a motor. The motor valve is configured to apply any one of an engine RPM, an engine load, and an engine coolant temperature for opening and closing rate adjustment.

As an exemplary embodiment of the present invention, the built-in valve is an inflatable valve, and the inflatable valve performs the path switching with wax inflation. The inflatable valve is configured to apply the engine coolant temperature for opening and closing rate adjustment.

As an exemplary embodiment of the present invention, the thermoelectric module is provided with an internal fin configured to generate a flow resistance in flow rate of the engine coolant flowing into the heat exchange line.

As an exemplary embodiment of the present invention, the high temperature line is mounted with a flow rate adjustment valve configured to adjust the flow rate of the engine coolant.

As an exemplary embodiment of the present invention, the flow rate adjustment valve is configured to control engine coolant distribution to a high temperature radiator and a water pump mounted to the high temperature line, and any one heat exchanger of a heater core, an exhaust gas recirculation (EGR) cooler, an oil warmer, and an ATF warmer.

As an exemplary embodiment of the present invention, the low temperature line is mounted with an electric water pump and a low temperature radiator.

Furthermore, a coolant control thermoelectric generation method according to an exemplary embodiment of the present invention for achieving the object includes: distributing, by a flow rate adjustment valve, engine coolant, circulated to a water pump, to a high temperature radiator and a heat exchanger; adjusting, by a flow path switching valve integrated in an internal space of a thermoelectric module, the flow rate of the engine coolant with path switching to a heat exchange line, in which heat exchange effect occurs, and a bypass line, in which no heat exchange effect occurs, in the case of an engine coolant temperature configured for the thermoelectric generation of the thermoelectric module due to a temperature difference from low temperature coolant circulating a low temperature radiator by an electric water pump; and controlling, by a flow path controller, the flow path switching valve in any one of a thermoelectric generation operation mode A of a thermoelectric generation region, a thermoelectric generation operation mode B of a thermoelectric generation/engine cooling combined region, a thermoelectric generation operation mode C of an engine cooling region, and a thermoelectric generation operation mode D of a thermoelectric generation/engine cooling blocking region.

As an exemplary embodiment of the present invention, in the thermoelectric generation operation mode A, the heat exchange effect occurs in the heat exchange line by opening the thermoelectric module side of the flow rate adjustment valve, driving the water pump and the electric water pump, and opening the heat exchange line and closing the bypass line by the opening of the flow path switching valve. The thermoelectric generation operation mode A is a region where an engine cooling demand amount is small and an engine coolant temperature target value is high.

As an exemplary embodiment of the present invention, in the thermoelectric generation operation mode B, the heat exchange effect occurs in the heat exchange line by opening the thermoelectric module side of the flow rate adjustment valve, driving the water pump and the electric water pump, and partially opening the heat exchange line and partially opening the bypass line by the opening of the flow path switching valve. The thermoelectric generation operation mode B is a region where an engine cooling demand amount is large and an engine coolant temperature target value is high.

As an exemplary embodiment of the present invention, in the thermoelectric generation operation mode C, no heat exchange effect occurs in the heat exchange line by opening the thermoelectric module side of the flow rate adjustment valve, driving the water pump, stopping the electric water pump, and closing the heat exchange line and opening the bypass line by the opening of the flow path switching valve. The thermoelectric generation operation mode C is a region where an engine cooling demand amount is large and an engine coolant temperature target value is low.

As an exemplary embodiment of the present invention, in the thermoelectric generation operation mode D, no heat exchange effect occurs in the heat exchange line by closing the thermoelectric module side of the flow rate adjustment valve, stopping the water pump and the electric water pump, and closing the heat exchange line and closing the bypass line by the closing of the flow path switching valve. The thermoelectric generation operation mode D is a region where an engine cooling demand amount is small and an engine coolant temperature target value is low.

As an exemplary embodiment of the present invention, any one of an engine RPM, an engine load, and an outside air temperature is applied as the operation condition.

The circuit integrated type coolant thermoelectric generation system according to an exemplary embodiment of the present invention, which implements the coolant control thermoelectric generation, implements the following operations and effects.

Firstly, it is possible to reduce the number of the flow path control valves even while maintaining a configuration of the primary and secondary cooling circuits, simplifying the system complexity and optimizing the system. Secondly, the high temperature coolant at the rear end portion of the flow rate adjustment valve of the engine outlet may adjust the flow rate of the engine coolant flowing into the high temperature radiator and the thermoelectric module, as compared to the conventional system, which controls the flow rate branched to the high temperature radiator and the thermoelectric module at the rear end portion of the coolant branched from the coolant high temperature circuit (for example, the primary cooling circuit). Thirdly, even if the four valves (for example, FRAV, two SVs, and Thermostat), which are required for the high temperature coolant at the rear end portion of the flow rate adjustment valve of the engine outlet to adjust the flow rate of the engine coolant flowing into the high temperature radiator and the thermoelectric module, are reduced to the two valves, the coolant high temperature circuit (for example, the primary cooling circuit) may be adjusted. Fourthly, the flow path of the coolant flowing through the high temperature radiator of the primary cooling circuit and the low temperature radiator of the secondary cooling circuit may be mounted integrally into the thermoelectric module. Fifthly, it is possible to integrate the coolant bypass circuit in the thermoelectric module, significantly saving the engine compartment installation space required for constructing the flow path circuit even while having a simple structure.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 3 is a diagram showing an example of a configuration a motor type built-in circuit integrated inside a thermoelectric module according to an exemplary embodiment of the present invention.

FIG. 4 is a diagram showing an example of a configuration an inflation type built-in circuit integrated inside a thermoelectric module according to an exemplary embodiment of the present invention.

FIG. 7 is a diagram showing a thermoelectric generation maximum control state of the coolant thermoelectric generation system according to an exemplary embodiment of the present invention.

FIG. 8 is a diagram showing a thermoelectric generation intermediate control state of the coolant thermoelectric generation system according to an exemplary embodiment of the present invention.

FIG. 10 is a diagram showing a thermoelectric generation stop control state of the coolant thermoelectric generation system according to an exemplary embodiment of the present invention.

Figure 1:
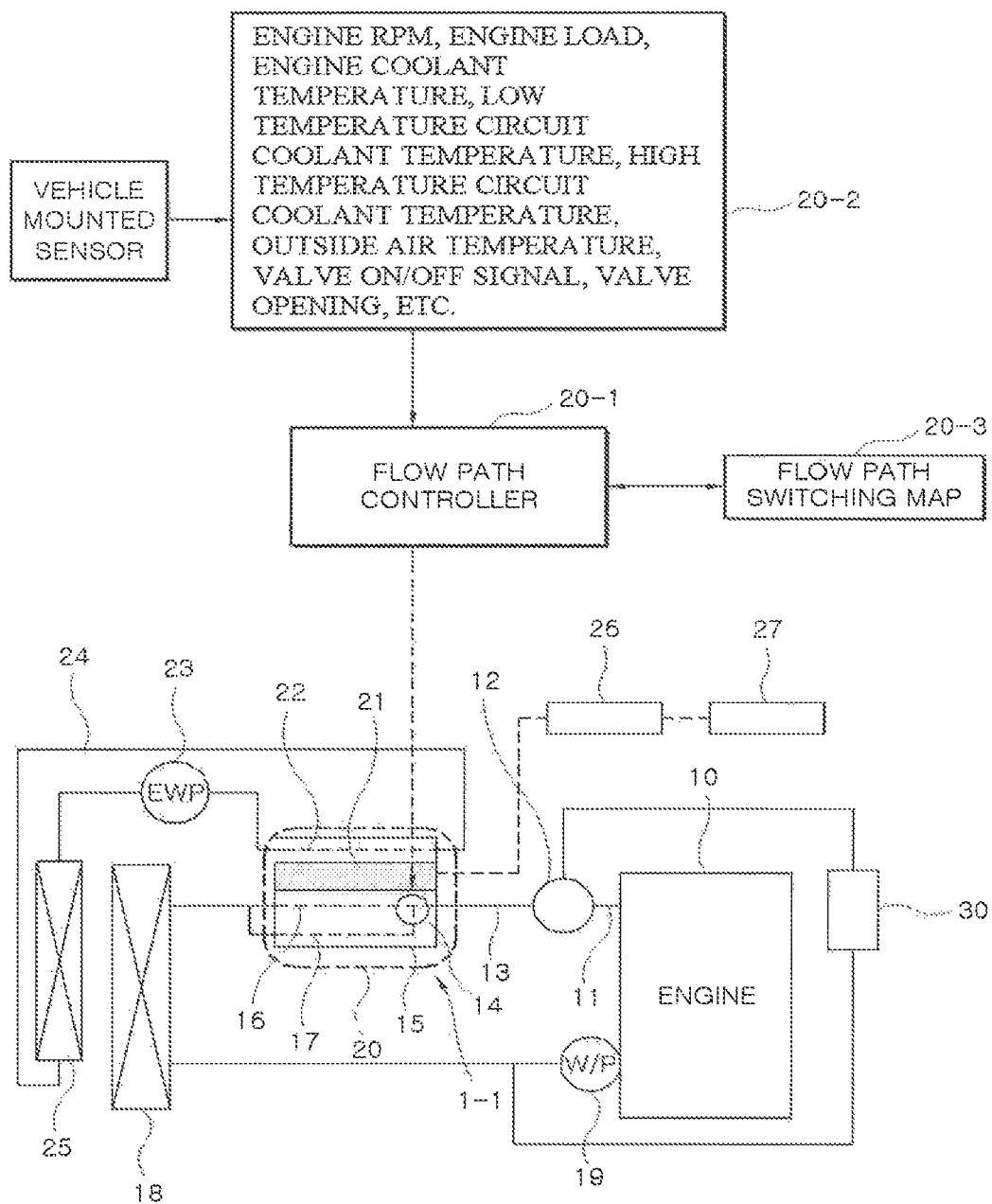
FIG. 1 is a block diagram of a circuit integrated type coolant thermoelectric generation system according to an exemplary embodiment of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Hereinafter, embodiments of the present invention will be described in detail with reference to the accompanying drawings, but such embodiments are only for illustrative purpose, and the present invention may be implemented in various different forms by those skilled in the art to which an exemplary embodiment of the present invention pertains, and thus is not limited to the exemplary embodiments described herein.

Referring to FIG. 1, a coolant thermoelectric generation system includes an engine 10, a flow rate adjustment valve 12, engine cooling circuits 13, 18, 19, a thermoelectric module 20, a flow path controller 20-1, and power generation cooling circuits 23, 24, 25. The coolant thermoelectric generation system includes a circuit integrated type coolant thermoelectric generation system by replacing an external heat exchange flow path with a built-in circuit 1-1 integrated inside the thermoelectric module 20. In the instant case, the built-in circuit 1-1 includes a valve type built-in circuit 1-1A (see FIG. 2), a motor type built-in circuit 1-1 (see FIG. 3), and an inflation type built-in circuit 1-1C (see FIG. 4).

Therefore, the circuit integrated type coolant thermoelectric generation system may simplify the circuit branch layout of the engine cooling circuits 13, 18, 19 through which high temperature coolant circulates through the thermoelectric module 20 and the power generation cooling circuits 23, 24, 25 through which low temperature coolant circulates, reduce the number of flow path control valves (for example, FRAV, SV, and Thermostat), and simplify the valve control logic.

The engine 10 may be a gasoline or a diesel engine as an internal combustion engine, and includes an engine inlet for introducing engine coolant and an engine outlet 11 for discharging the engine coolant. The engine outlet 11 is connected to a high temperature line 13 of the engine cooling circuits 13, 18, 19 to which a flow rate adjustment valve 12 is mounted.

The engine cooling circuits 13, 18, 19 include the flow rate adjustment valve 12, the high temperature line 13, a high temperature radiator 18, a water pump 19, and a heat exchanger 30. In the instant case, the engine cooling circuits 13, 18, 19 have an engine coolant reservoir for supplying and refilling the engine coolant.

For example, the flow rate adjustment valve 12 controls the flow path of the engine coolant together with the engine outlet 11, and individually controls the flow rates of the high temperature radiator 18 and the heat exchanger 30. To the present end, the flow rate adjustment valve 12 is mounted to the high temperature line 13 at a position close to the engine outlet 11 side thereof.

For example, the high temperature line 13 forms a closed circuit, in which the engine coolant circulates, by connecting the engine inlet and the engine outlet, and is divided into a cooling flow path connected to the engine 10→the flow rate adjustment valve 12→the thermoelectric module 20→the high temperature radiator 18→the water pump 19→the engine 10, and a branch flow path connected to the flow rate adjustment valve 12→the heat exchanger 30→the water pump 19. In the instant case, the "→" means a flow direction of the engine coolant.

The high temperature line 13 is connected to a heat exchange line 16 formed in the built-in heat exchange circuit 1-1 of the thermoelectric module 20 at a large coolant temperature difference by which the heat exchange effect occurs or connected to a bypass line 17 formed in the built-in heat exchange circuit 1-1 of the thermoelectric module 20 at a small coolant temperature difference by which the heat exchange effect occurs little. In the instant case, the flow path switching between the heat exchange line 16 and the bypass line 17 is performed under control of the flow path controller 20-1 which is configured to control a built-in valve provided to the built-in circuit 1-1.

For example, the high temperature radiator 18 cools the high temperature coolant coming from the engine 10 by heat exchange with the atmosphere. The water pump 19 pumps the engine coolant to form a coolant circulation flow in the high temperature line 13. The heat exchanger 30 exchanges heat with the operating fluid passing through the internal thereof with the engine coolant distributed through the flow rate adjustment valve 12.

The water pump 19 is a mechanic water pump connected to a crankshaft of the engine 10 by a belt or a chain or an electric water pump operated by a control signal of an Electronic Control Unit (ECU). The heat exchanger 30 includes a heater core for increasing the outside air temperature by exchanging heat with the engine coolant, an Exhaust Gas Recirculation (EGR) cooler for decreasing an exhaust gas recirculation (EGR) gas temperature, which is sent to the engine, in the exhaust gas by exchanging heat with the engine coolant, an oil warmer for increasing an engine oil temperature by exchanging heat with the engine coolant, an Auto Transmission Fluid (ATF) warmer for increasing an ATF temperature (transmission oil temperature) by exchanging heat with the engine coolant, and the like.

The thermoelectric module 20 includes a module high temperature chamber 15 in which the built-in circuit 1-1 is integrated, a thermoelectric element 21, and a module low temperature line 22.

For example, the module high temperature chamber 15 is formed in the lower section (or one side section) of the thermoelectric element 21 which partitions the interior of the thermoelectric module into two spaces. The thermoelectric element 21 generates electricity by the thermoelectric generation having the heat exchange effect due to a coolant temperature difference, to supply the electricity to a battery 26 and/or a power consumption device 27. The module low temperature line 22 is formed in the upper section (or the other side section) of the thermoelectric element 21 formed as a module low temperature chamber.

The module high temperature chamber 15 is connected to the high temperature line 13 of the engine cooling circuit. The module low temperature line 22 is connected to a low temperature line 24 of the power generation cooling circuit. The power consumption device 27 includes a heater, a Positive Temperature Coefficient (PTC), an Electrically Heated Catalyst (ECH), and the like.

For example, the built-in circuit 1-1, which is the valve type built-in circuit 1-1A (see FIG. 2) integrated in the module high temperature chamber 15, includes a flow path switching valve 14 applied as the built-in valve, the module high temperature line 16, and the bypass line 17. In the instant case, even if the built-in valve is completely open to the bypass line 17, the built-in valve is configured to apply a flow path opening and closing rate at which a small amount of coolant corresponding to a distribution ratio according to the resistance fraction between the heat exchange line 16 and the bypass line 17 flows into the heat exchange line 16.

An internal fin 17-2 (see FIG. 3 and FIG. 4) is formed in the internal space of the module high temperature chamber 15 to increase the heat exchange performance of the heat exchange line 16, and the module high temperature chamber 15 is designed in consideration of the engine coolant flow rate corresponding to the distribution ratio of the resistance fraction according to the presence or absence of the internal fin between the heat exchange line 16 and the internal space of the bypass line 17 to which the internal fin 17-2 is not applied relatively.

Furthermore, the flow path switching valve 14 connects the high temperature line 13 of the engine cooling circuit to the heat exchange line 16 or connects the high temperature line 13 of the engine cooling circuit to the bypass line 17 so that the thermoelectric element 21 may perform the thermoelectric generation having the heat exchange effect at the large coolant temperature difference. In the instant case, the path switching of the flow path switching valve 14 is based on the engine coolant temperature, and the engine coolant temperature is determined by the flow path controller 20-1.

Therefore, the heat exchange line 16 and the high temperature line 13 are connected to each other when the engine coolant temperature is high, such that the thermoelectric generation is performed in the thermoelectric element 21 by the heat exchange effect between the relatively low temperature coolant and the engine coolant flowing from the low temperature line 24 of the power generation cooling circuit to the module low temperature line 22. On the other hand, the bypass line 17 and the high temperature line 13 are connected to each other when the engine coolant temperature is low, such that the engine coolant is discharged from the thermoelectric module 20 without the heat exchange effect. Here, the high and low of the engine coolant temperature are determined by the temperature at which thermoelectric generation is generated by the heat exchange effect. Therefore, since the high and low of the engine coolant temperature are changed according to the thermoelectric generation performance of the thermoelectric element 21, no specific temperature value is exemplified.

The flow path controller 20-1 controls the flow rate adjustment valve 12 for controlling the flow rate adjustment and direction switching of the engine coolant, the flow path switching valve 14 for switching the direction of the engine coolant, and an electric water pump 23 for circulating the low temperature coolant of the power generation cooling circuit. To this end, the flow path controller 20-1 is configured as a Central Processing Unit having a memory in which valve control logic and pump driving logic have been stored. Therefore, the flow path controller 20-1 may be an engine Electronic Control Unit (ECU).

The flow path controller 20-1 includes a data input unit 20-2 and a flow path switching map 20-3. The data input unit 20-2 detects, as input data, an engine revolutions per minute (RPM), an engine load, an engine coolant temperature, a low temperature circuit coolant temperature, a high temperature circuit coolant temperature, an outside air temperature, a valve ON/OFF signal, and a valve opening to provide the input data to the flow path controller 20-1. The flow path switching map 20-3 has a mapping table for mapping the valve opening amount and the pump RPM relative to the coolant temperature difference, and provides the matching result to the flow path controller 20-1.

The power generation cooling circuits 23, 24, 25 include the electric water pump 23, the low temperature line 24, and a low temperature radiator 25 to circulate the low temperature coolant. In the instant case, the power generation cooling circuits 23, 24, 25 have a low temperature coolant reservoir for supplying and refilling the low temperature coolant.

For example, the electric water pump 23 is driven by the control of the flow path controller 20-1 to pump the low temperature coolant, the low temperature line 24 forms a path through which the low temperature coolant flows, and the low temperature radiator 25 cools the low temperature coolant, which has been heated through the heat exchange with the engine coolant, by exchanging heat with the atmosphere.

Therefore, the low temperature line 24 connects the electric water pump 23, the module low temperature line 22 of the thermoelectric module 20, and the low temperature radiator 25 to form a closed circuit in which the low temperature coolant circulates, and the flow of the electric water pump 23→the thermoelectric module 20→the low temperature radiator 25 is formed as the coolant circulation flow. In the instant case, the "→" means the flow direction of the engine coolant.

Figure 2:
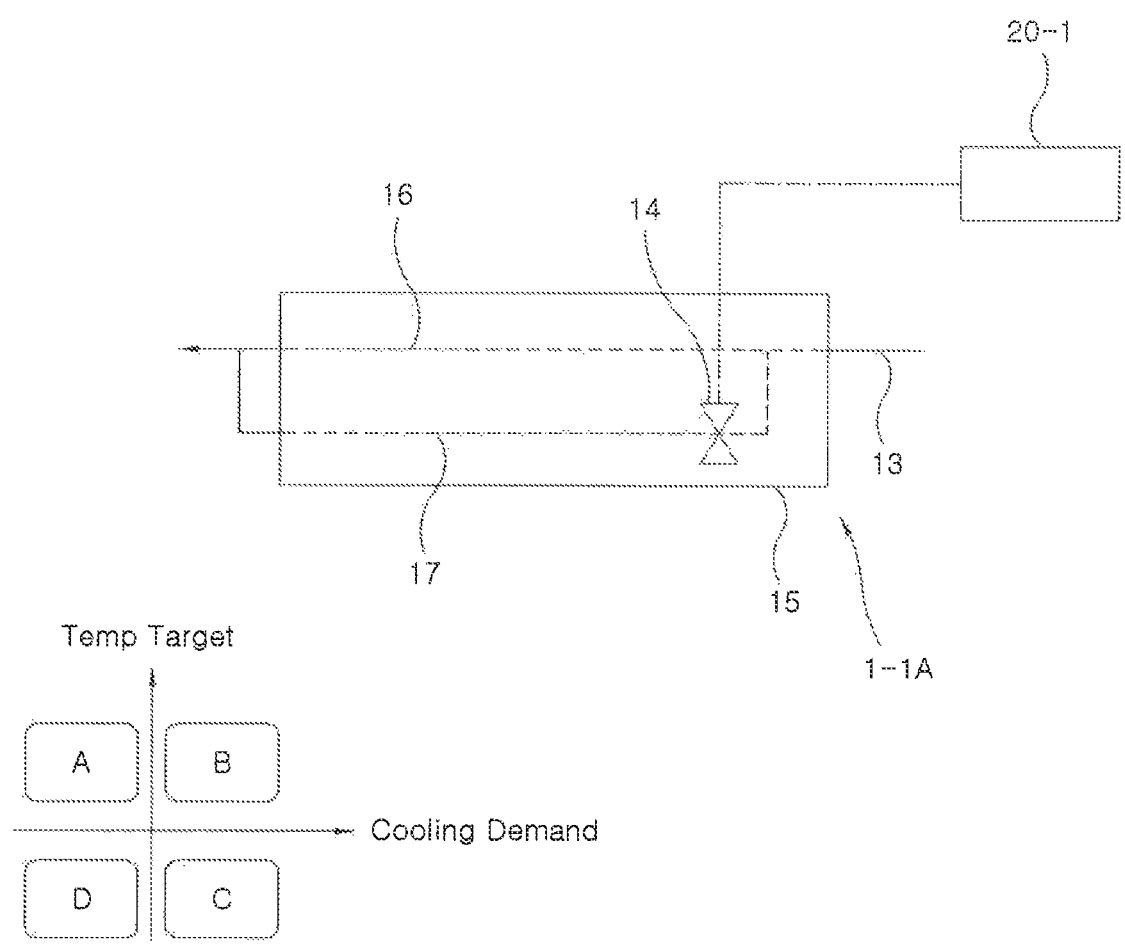
FIG. 2 is a diagram showing an example of a configuration of a valve type built-in circuit integrated inside a thermoelectric module according to an exemplary embodiment of the present invention.

Meanwhile, FIG. 2 shows an operation state of the valve type built-in circuit 1-1A in which the built-in circuit 1-1 applies the flow path switching valve 14 as a built-in valve. In the instant case, the flow path switching valve 14 has a flow path opening and closing rate at which a small amount of coolant flows when the heat exchange line 16 is blocked.

As shown, the valve type built-in circuit 1-A has the heat exchange line 16 which is connected to the high temperature line 13 of the engine cooling circuit and formed inside the thermoelectric module 20, the bypass line 17 which is branched from the heat exchange line 16 inside the thermoelectric module 20 and then connected to the high temperature line 13 outside the thermoelectric module 20, and the flow path switching valve 14 which is mounted to the bypass line 17.

Therefore, the flow path switching valve 14 may bypass a portion of the flow rate of the engine coolant for the heat exchange line 16, which flows through the high temperature line 13 of the engine cooling circuit, to the bypass line 17 by adjusting the flow path opening and closing rate of the bypass line 17 under the opening control of the flow path controller 20-1.

The flow path controller 20-1 has thermoelectric generation operation mode logic (see FIG. 5) for the flow path opening and closing rate, which classifies the region required for cooling the engine 10 into a thermoelectric generation region and an engine cooling region by the thermoelectric element 21 of the thermoelectric module 20, and the thermoelectric generation operation mode logic is constructed based on the engine RPM, the engine load, the engine coolant temperature, and the outside air temperature among the input data of the data input unit 20-2.

For example, the thermoelectric generation operation mode logic may be classified into four conditions, i.e., thermoelectric generation operation modes A, B, C and D, by the difference between an engine cooling demand amount and an engine coolant temperature target value by use of any one of the engine RPM, the engine load, the outside air temperature, and the engine operation environment as an operation condition. The thermoelectric generation operation mode an includes a thermoelectric generation region sufficient for thermoelectric generation, the thermoelectric generation operation mode B includes a thermoelectric generation/engine cooling combined region all requiring the cooling of the thermoelectric generation system and the existing cooling of a vehicle, the thermoelectric generation operation mode C includes an engine cooling region requiring only the existing cooling of the vehicle, and the thermoelectric generation operation mode D includes a thermoelectric generation/engine cooling blocking region requiring none of the existing cooling of the thermoelectric generation system and the vehicle.

Furthermore, FIG. 3 shows an example in which the built-in circuit 1-1 includes the motor type built-in circuit 1-B, and FIG. 4 shows an example in which the built-in circuit 1-1 includes the inflation type built-in circuit 1-1C.

Referring to the motor type built-in circuit 1-1B of FIG. 3, the motor type built-in circuit 1-1B applies a motor valve 14-1 as a built-in valve. In the instant case, the motor valve 14-1 applies a flow path opening and closing rate at which a small amount of coolant flows when the heat exchange line 16 is blocked.

The module high temperature chamber 15 of the thermoelectric module 20 provides the motion of the motor valve 14-1 by forming a valve passage 17-1 in a separating plate 17A in which the heat exchange line 16 and the bypass line 17 are partitioned, and forms a turbulent flow in the engine coolant flow by allowing the internal fin 17-2 to protrude into the upper space of the separating plate 17A (that is, the location space of the heat exchange line 16), increasing the heat exchange effect. Therefore, the internal fin 17-2 increases the heat exchange performance of the heat exchange line 16, and the module high temperature chamber 15 is designed in consideration of the engine coolant flow rate corresponding to the distribution ratio of the resistance fraction according to the presence or absence of the internal fin between the heat exchange line 16 and the internal space of the bypass line 17 to which the internal fin 17-2 is not applied relatively.

The motor valve 14-1 is integrated in the module high temperature chamber 15 of the thermoelectric module 20, and includes a spool 14A, a valve rod 14B, a screw 14C, a gear 14D, and a motor 14E.

For example, the spool 14A opens and closes the valve passage of the separating plate 17-1. The valve rod 14B fixes the spool 14A and the screw 14C. The screw 14C moves the spool 14A vertically with respect to the valve passage of the separating plate 17-1 in the rotation direction thereof. The gear 14D rotates the screw 14C. The motor 14E is driven by the control of the flow path controller 20-1 to rotate the gear 14D.

Therefore, the motor valve 14-1 is configured as a thermoelectric module control valve in which the motor 14E is opened or closed so that the opening and closing rate thereof is adjusted according to the engine RPM and the engine load or the engine coolant temperature of the engine cooling circuit. However, the motor valve 14-1 is configured as a thermoelectric module control valve in which the opening and closing rate of the motor 14E is adjusted according to the output signals (for example, Pulse Width Modulation (PWM) duty) of the thermoelectric generation operation modes A, B, C and D of the flow path controller 20-1 like the flow path switching valve 14.

Referring to the inflation type built-in circuit 1-1C of FIG. 4, the inflation type built-in circuit 1-1C applies an inflatable valve 14-2 as a built-in valve. In the instant case, the inflatable valve 14-2 has a flow path opening and closing rate at which a small amount of coolant flows when the heat exchange line 16 is blocked.

The module high temperature chamber 15 of the thermoelectric module 20 provides the motion of the inflatable valve 14-2 by forming the valve passage 17-1 in the separating plate 17A in which the heat exchange line 16 and the bypass line 17 are partitioned, and forms a turbulent flow in the engine coolant flow by allowing the internal fin 17-2 to project into the upper space of the separating plate 17A (that is, the location space of the heat exchange line 16), increasing the heat exchange effect.

The inflatable valve 14-2 includes a spool 141, an inflatable rod 14F, a wax holder 14G, a fixing rod 14H, and a spring 14J.

For example, the spool 141 opens and closes the valve passage 17-1 of the separating plate 17A. The inflatable rod 14F connects the spool 141 and the wax holder 14G. The wax holder 14G inflates when the temperature of the engine coolant increases, whereas the wax holder 14G deflates when the temperature thereof decreases, vertically moving the spool 141. The inflatable rod 14F generates a downward movement force by a repulsive force by a rod fixing portion 14K when the wax holder 14G is inflated. The fixing rod 14H receives the downward movement force to lower the spool 141 so that the valve passage 17-1 of the separating plate 17A is opened by the spool 14. The spring 14J provides an elastic repulsive force to the spool 141. The rod fixing portion 14K fixes the end portion of the inflatable rod 14F to limit the upward movement of the inflatable rod 14F so that the inflatable rod 14F generates the downward movement force.

Therefore, the inflatable valve 14-2 may perform the automatic opening and closing operation of the valve passage 17-1 using the inflation/deflation of the wax of the wax holder 14G, implementing the thermostat effect according to the temperature of the engine coolant. Therefore, since the inflatable valve 14-2 does not require the control of the flow path controller 20-1, the inflatable valve 14-2 may greatly contribute to simplifying the structure of the coolant thermoelectric generation system by eliminating the flow path controller 20-1.

Figure 5:
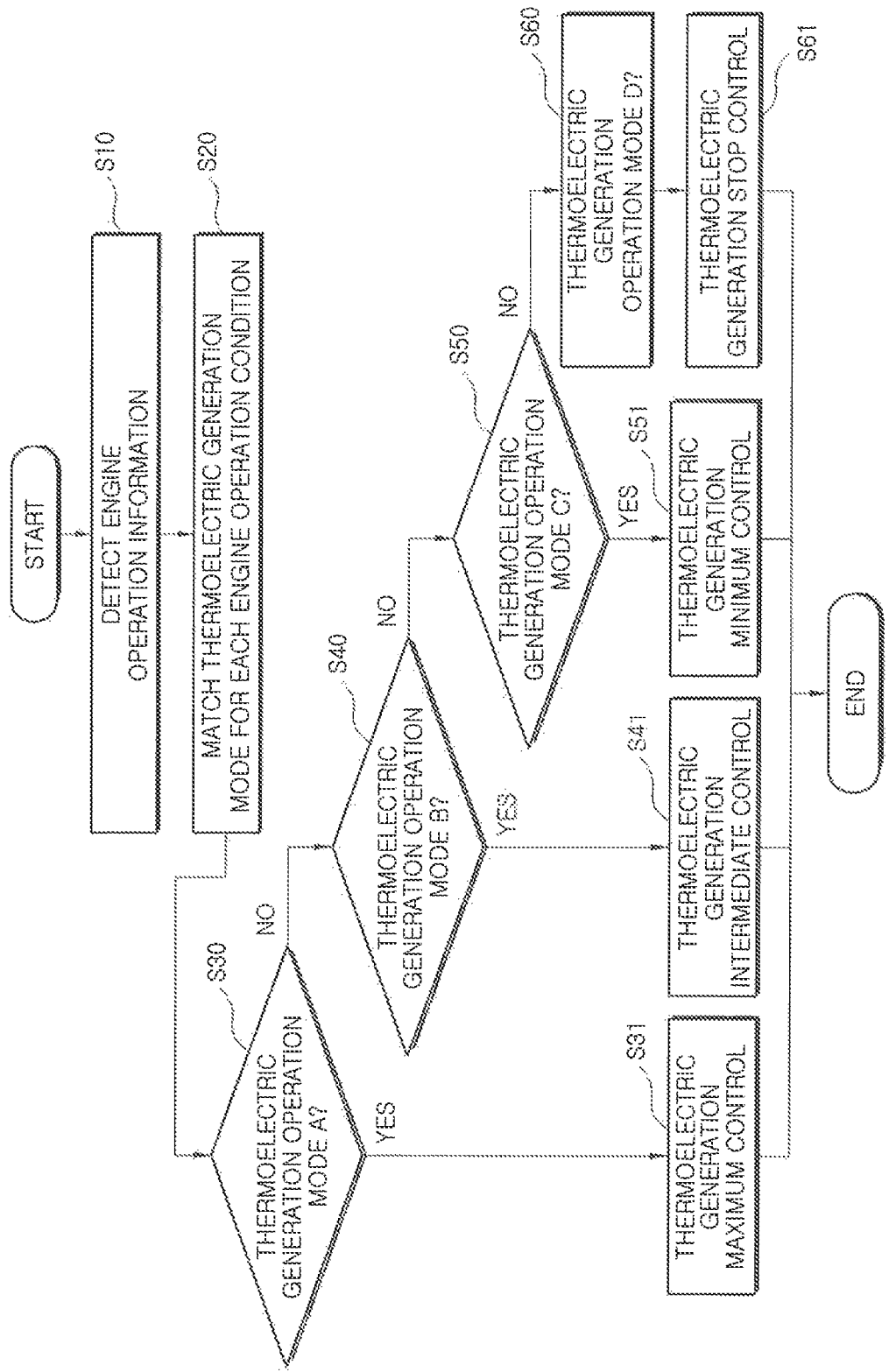
FIG. 5 is a flowchart of a coolant control thermoelectric generation method using the coolant thermoelectric generation system according to an exemplary embodiment of the present invention.

Meanwhile, FIG. 5 shows a coolant control thermoelectric generation method for the coolant thermoelectric generation system 1, and will be described in detail with reference to FIGS. 6 to 10. In the instant case, the control subject is the flow path controller 20-1, and the control target may be the flow path switching valve 14 together with the electric water pump 23 and the flow rate adjustment valve 12, but the motor valve 14-1 or the inflatable valve 14-2 instead of the flow path switching valve 14.

First, the flow path controller 20-1 performs detecting engine operation information (S10) and matching a thermoelectric generation mode for each engine operation condition (S20).

Figure 6:
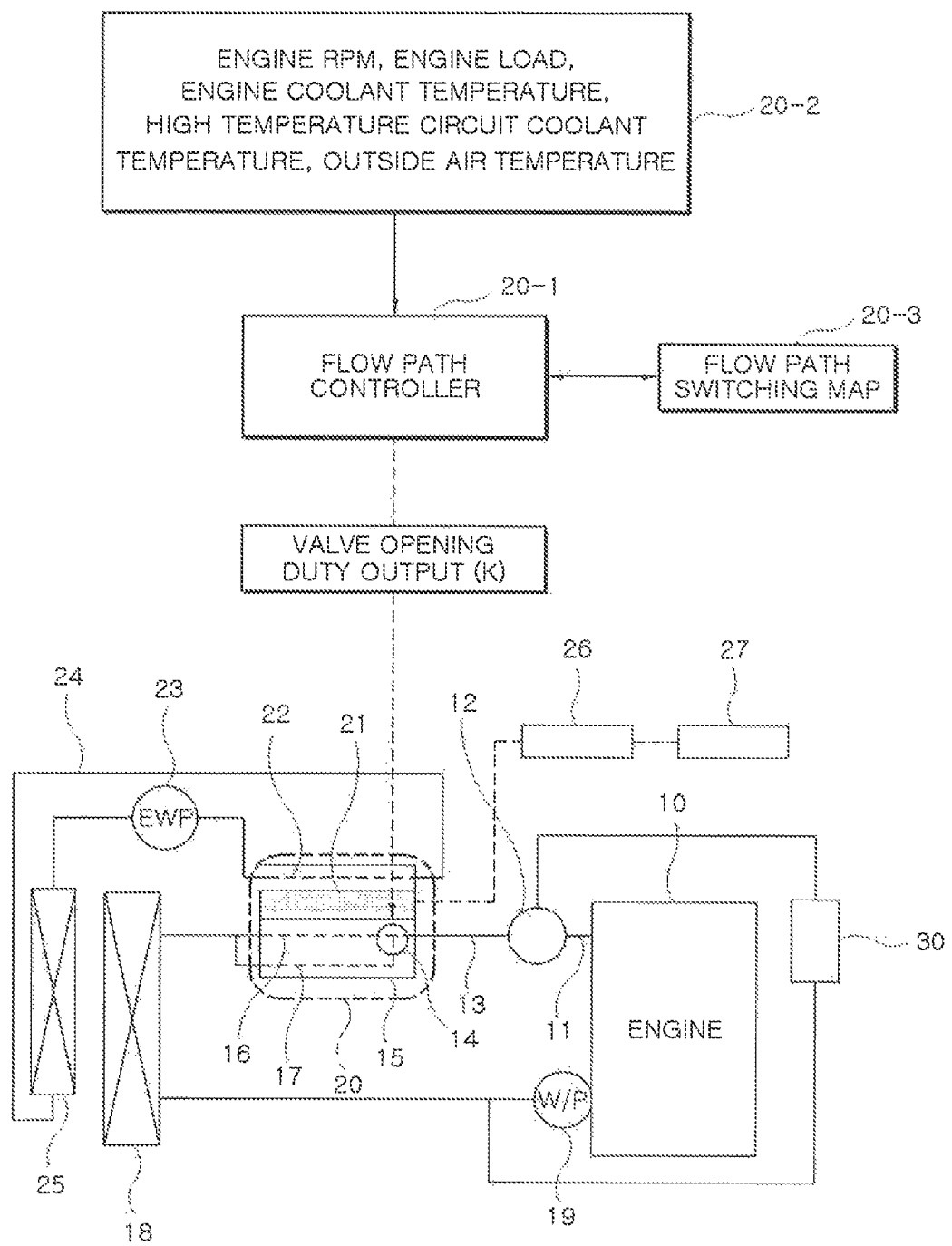
FIG. 6 is a diagram showing an operation state of the coolant thermoelectric generation system which implements the coolant control thermoelectric generation method according to an exemplary embodiment of the present invention.

Referring to FIG. 6, the flow path controller 20-1 performs the detecting of the engine operation information (S10) by confirming, as current input data, a vehicle speed, an engine RPM, an engine load, an engine coolant temperature, a low temperature circuit coolant temperature, a high temperature circuit coolant temperature, an outside air temperature, a valve ON/OFF signal, and a valve opening, in which the engine 10 is detected by the data input unit 20-2 at operation.

Furthermore, the flow path controller 20-1 completes the matching of the thermoelectric generation mode for each engine operation condition (S20) by confirming the result matched to the mapping table of the flow path switching map 20-3 by using, as basic factors, the engine load and the engine coolant temperature while using, as the operation conditions, the engine cooling demand amount and the engine coolant temperature target value based on the vehicle speed, the engine load, and the outside air temperature among the current input data.

Subsequently, the flow path controller 20-1 operates the coolant thermoelectric generation system by applying any one of the thermoelectric generation operation mode A (S30), the thermoelectric generation operation mode B (S40), the thermoelectric generation operation mode C (S50), and the thermoelectric generation operation mode D (S60) according to the engine operation conditions.

For example, the thermoelectric generation operation mode A (S30) is performed by a thermoelectric generation maximum control (S31), and the thermoelectric generation maximum control (S31) is applied to a thermoelectric generation region which is a cooling region sufficient for thermoelectric generation.

Referring to FIG. 7, the thermoelectric generation maximum control (S31) is performed in a region where the engine cooling demand amount is small and the engine coolant temperature target value is high, by using, as operation conditions, any one of the engine RPM, the engine load, the outside air temperature, and the engine operating environment.

Therefore, the flow path controller 20-1 drives the water pump 19 and the electric water pump 23 while opening the flow rate adjustment valve 12 to the thermoelectric module side. At the same time, the flow path controller 20-1 opens the flow path switching valve 14 to open the heat exchange line 16 and close the bypass line 17 so that the high temperature engine coolant flowing from the engine 10 to the high temperate line 13 of the engine cooling circuit fully flows into only the heat exchange line 16 without bypassing to the bypass line 17.

Therefore, the thermoelectric module 20 flows the low temperature coolant of the low temperature line 24 to the module low temperature line 22 and at the same time, flows the engine coolant of the high temperature line 13 to the heat exchange line 16 with the thermoelectric element 21 therebetween. Accordingly, the thermoelectric element 21 generates electricity by forming a thermoelectric generation state with the heat exchange effect occurring due to the temperature difference between the engine coolant and the low temperature coolant, supplying the electricity to the battery 26 and/or the power consumption device 27.

Furthermore, the low temperature coolant which flows out of the thermoelectric module 20 with the temperature thereof increased in the thermoelectric module 20 flows into the low temperature radiator 25 through the low temperature line 24, being cooled through the low temperature radiator 24. On the other hand, the engine coolant performs engine cooling with the heat dissipation amount which is thermoelectric to the module low temperature line 22 within the thermoelectric module 20.

For example, the thermoelectric generation operation mode B (S40) is performed by a thermoelectric generation intermediate control (S41), and the thermoelectric generation intermediate control (S41) is applied to a thermoelectric generation/engine cooling combined region in which the existing cooling of the thermoelectric generation system and the vehicle are all required.

Referring to FIG. 8, the thermoelectric generation intermediate control (S41) is performed in a region where the engine cooling demand amount is large and the engine coolant temperature target value is high, by using, as operation conditions, any one of the engine RPM, the load, the outside air temperature, and the engine operating environment.

Therefore, the flow path controller 20-1 drives the water pump 19 and the electric water pump 23 while opening the flow rate adjustment valve 12 to the thermoelectric module side. At the same time, the flow path controller 20-1 partially opens the flow path switching valve 14 to partially open the heat exchange line 16 and the bypass line 17 so that the high temperature engine coolant, which flows out of the engine 10 to flow to the high temperature line 13 of the engine cooling circuit, dividedly flows into the heat exchange line 16 and the bypass line 17.

Therefore, the thermoelectric module 20 flows the low temperature coolant of the low temperature line 24 to the module low temperature line 22 and at the same time, dividedly flows the engine coolant of the high temperature line 13 to the heat exchange line 16 and the bypass line 17 with the thermoelectric element 21 therebetween. Accordingly, the thermoelectric element 21 forms the thermoelectric generation state with the heat exchange effect occurring due to the temperature difference between the engine coolant flowing through the heat exchange line 16 and the low temperature coolant, and simultaneously, the engine coolant flowing through the bypass line 17 directly flows into the high temperature radiator 18 to increase the heat exchange amount of the high temperature radiator 18, implementing an increase in the engine cooling amount suitable for the high load operation.

Therefore, the thermoelectric module 20 generates relatively smaller electricity than the thermoelectric generation operation mode A (S30), supplying the electricity to the battery 26 and/or the power consumption device 27.

Furthermore, the low temperature coolant which flows out of the thermoelectric module 20 with the temperature thereof increased in the thermoelectric module 20 flows into the low temperature radiator 25 through the low temperature line 24, being cooled through the low temperature radiator 25. On the other hand, the engine coolant performs engine cooling by the heat dissipation amount which is thermoelectric to the module low temperature line 22 within the thermoelectric module 20 and the heat exchange amount of the high temperature radiator 18.

For example, the thermoelectric generation operation mode C (S50) is performed by a thermoelectric generation minimum control (S51), and the thermoelectric generation minimum control (S51) is applied to an engine cooling region which is a region where only vehicle cooling is performed as before.

Figure 9:
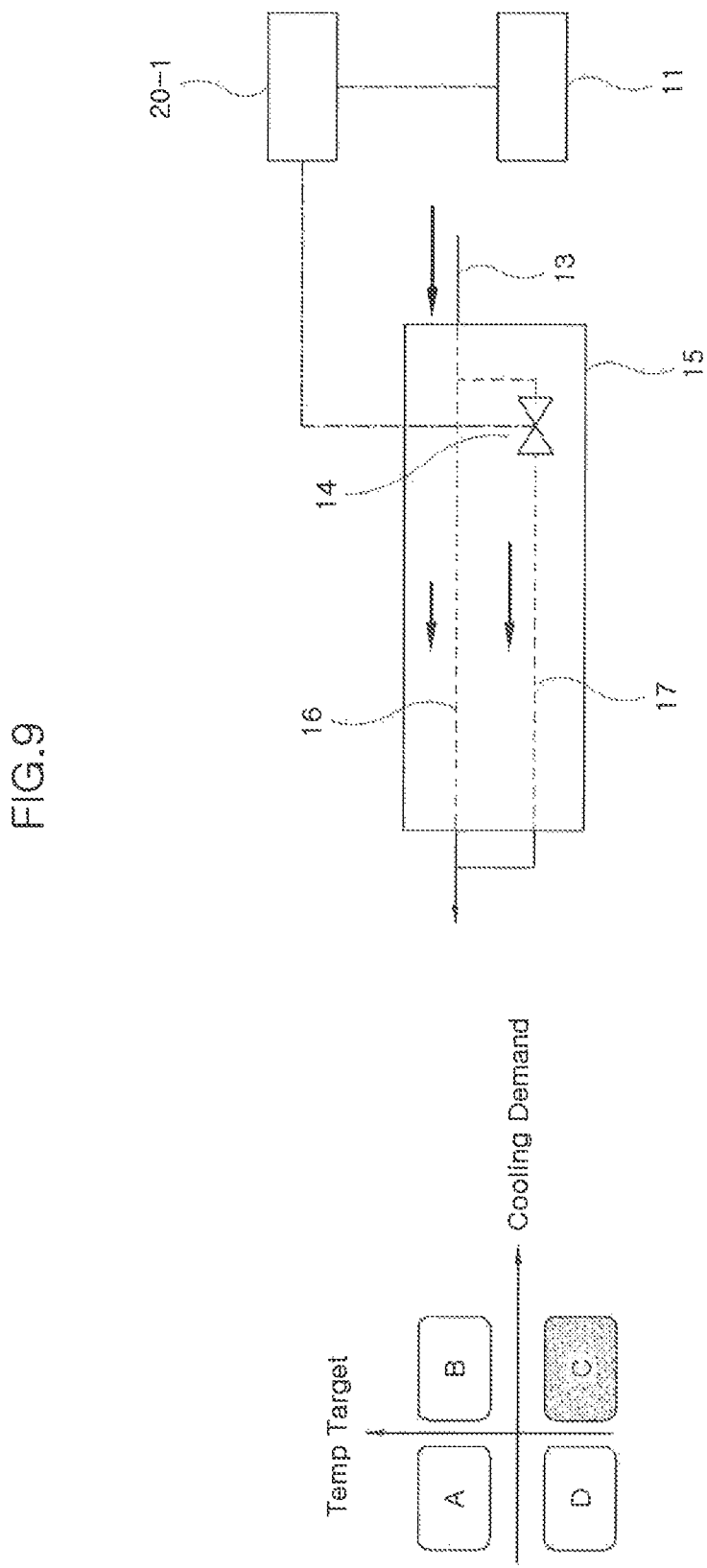
FIG. 9 is a diagram showing a thermoelectric generation minimum control state of the coolant thermoelectric generation system according to an exemplary embodiment of the present invention.

Referring to FIG. 9, the thermoelectric generation intermediate control (S41) is performed in a region where the engine RPM is high or the load is high, the region corresponding to a region where the engine cooling demand amount is large and the engine coolant temperature target value is low, by using, as operation conditions, any one of the engine RPM, the load, the outside air temperature, and the engine operating environment.

Therefore, the flow path controller 20-1 drives the water pump 19 while opening the flow rate adjustment valve 12 to the thermoelectric module 20 side, whereas the flow path controller 20-1 stops the electric water pump 23. At the same time, the flow path controller 20-1 opens the flow path switching valve 14 to close the heat exchange line 16 and maximally opens the bypass line 17 so that the high temperature engine coolant, which flows out of the engine 10 to flow into the high temperature line 13 of the engine cooling circuit, flows into only the bypass line 17. However, the engine coolant flows into the heat exchange line 16 by a small amount of cooling flow rate corresponding to the distribution ratio according to the line resistance fraction due to the flow path opening and closing rate applied to the flow rate adjustment valve 12.

Therefore, the thermoelectric module 20 is switched to a state having no thermoelectric generation in the thermoelectric element 21, whereas the engine coolant performs rapid engine cooling by the heat exchange amount of the high temperature radiator 18 without the thermoelectric heat dissipation amount of the thermoelectric module 20. In the instant case, the engine cooling circuit may perform the maximum cooling function like the existing performance, and as the flow cross-sectional area of the bypass line 17 is large due to the flow resistance of the internal fin 17-2 formed in the internal space of the high temperature chamber 15 of the thermoelectric module 20 and for increasing the heat exchange performance, more engine coolant flow rate flows toward the bypass line 17 when the entire flow path switching valve 14 is opened.

For example, the thermoelectric generation operation mode D (S60) is performed by a thermoelectric generation stop control (S61), and the thermoelectric generation stop control (S61) is applied to a thermoelectric generation/engine cooling blocking region, which is a region where the cooling of the thermoelectric generation system and the vehicle cooling are all unnecessary.

Referring to FIG. 10, the thermoelectric generation stop control (S61) may be performed in a region where the engine cooling demand amount is very small and the engine coolant temperature target value is also low by using, as operation conditions, any one of the engine RPM, the load, the outside air temperature, and the engine operating environment.

Therefore, the flow path controller 20-1 stops the water pump 19 and the electric water pump 23 while closing the flow rate adjustment valve 12. At the same time, the flow path controller 20-1 closes the flow path switching valve 14 to close both the heat exchange line 16 and the bypass line 17 so that the relatively low temperature engine coolant, which flows out of the engine 10 to flow into the high temperature line 13 of the engine cooling circuit, does not flow into the thermoelectric module 20.

Therefore, the thermoelectric module 20 is switched to the state having no thermoelectric generation in the thermoelectric element 21 and at the same time the engine coolant circulates inside the engine 10. In the instant case, the flow path controller 20-1 may adjust the opening and closing of the flow path switching valve 14 in conjunction with the flow rate adjustment valve 12.

As described above, the circuit integrated type coolant thermoelectric generation system according to the exemplary embodiment includes the flow path switching valve 14 integrated in the internal space of the thermoelectric module 20 where the thermoelectric generation occurs by the heat exchange effect due to the temperature difference between the engine coolant and the low temperature coolant, and the heat exchange effect occurs or does not occur by performing, by the flow path switching valve 14, the path switching in any one of the thermoelectric generation operation mode A of the thermoelectric generation region, the thermoelectric generation operation mode B of the thermoelectric generation/engine cooling combined region, the thermoelectric generation operation mode C of the engine cooling region, and the thermoelectric generation operation mode D of the thermoelectric generation/engine cooling blocking region, with the change in the engine cooling demand amount and the engine coolant temperature target value according to the operation condition, improving and optimizing the system complexity by the simplification of the cooling circuit layout, and reducing the installation space required for forming the circuit while achieving the simple flow path control for the high temperature coolant circuit with the mounted quantity of the reduced flow path control valve.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A coolant thermoelectric generation system comprising:
    a thermoelectric module connected to a high temperature line of engine cooling circuits connected to an engine wherein an engine coolant flows through the high temperature line, and to a low temperature line of power generation cooling circuits through which a coolant having a temperature lower than a temperature of the engine coolant flows, and configured to perform thermoelectric generation with a heat exchange effect based on a temperature difference between the engine coolant flowing in the high temperature line and the coolant flowing in the low temperature line, with a thermoelectric element interposed between the high temperature line and the low temperature line;
    a heat exchange line, in which the heat exchange effect occurs, and a bypass line, in which no heat exchange effect occurs, wherein the heat exchange line and the bypass line are connected to the high temperature line to form two paths, respectively;
    a controller; and
    a built-in valve located in an internal space of the thermoelectric module, and connected to the controller to adjust flow rates of the coolant in the heat exchange line and the bypass line by a path switching between the heat exchange line and the bypass line,
    wherein the heat exchange line is mounted with an internal fin.

2. The coolant thermoelectric generation system of claim 1,
    wherein the built-in valve is configured to apply a bypass line flow path opening and closing rate to the bypass line so that the engine coolant having a flow rate lower than a predetermined value, flows into the heat exchange line when the bypass line is opened.

3. The coolant thermoelectric generation system of claim 1,
    wherein the built-in valve is located at a branched site between the bypass line and the heat exchange line in the internal space of the thermoelectric module.

4. The coolant thermoelectric generation system of claim 1,
    wherein the built-in valve is a flow path switching valve, and
    wherein the flow path switching valve is configured to perform the path switching in one of a first thermoelectric generation operation mode, a second thermoelectric generation operation mode, a third thermoelectric generation operation mode, and a fourth thermoelectric generation operation mode, by use of an engine cooling demand amount and an engine coolant temperature target value.

5. The coolant thermoelectric generation system of claim 4,
    wherein the first thermoelectric generation operation mode is a thermoelectric generation region, the second thermoelectric generation operation mode is a thermoelectric generation/engine cooling combined region, the third thermoelectric generation operation mode is an engine cooling region, and the fourth thermoelectric generation operation mode is a thermoelectric generation/engine cooling blocking region.

6. The coolant thermoelectric generation system of claim 1,
    wherein the built-in valve is a motor valve, and
    wherein the motor valve is configured to perform the path switching with a screw rotation by a motor.

7. The coolant thermoelectric generation system of claim 6,
    wherein the motor valve is configured to apply one of an engine Revolution Per Minute (RPM), an engine load, and an engine coolant temperature for adjusting opening and closing rate of the motor valve to perform the path switching.

8. The coolant thermoelectric generation system of claim 1,
    wherein the built-in valve is an inflatable valve, and
    wherein the inflatable valve is configured to perform the path switching with wax inflation.

9. The coolant thermoelectric generation system of claim 8,
    wherein the inflatable valve is configured to apply the temperature of the engine coolant for adjusting opening and closing rate of the inflatable valve.

10. The coolant thermoelectric generation system of claim 1,
    wherein the high temperature line is mounted with a flow rate adjustment valve connected to the controller and configured to adjust a flow rate of the engine coolant, and
    wherein the flow rate adjustment valve is configured to control engine coolant distribution to a first radiator and a pump of the engine cooling circuits, wherein the first radiator and the pump are mounted to the high temperature line.

11. The coolant thermoelectric generation system of claim 10,
    wherein the flow rate adjustment valve is configured to control the engine coolant distribution to one of a heater core, an Exhaust Gas Recirculation (EGR) cooler, an oil warmer, and an Auto Transmission Fluid (ATF) warmer.

12. The coolant thermoelectric generation system of claim 1,
wherein the power generation cooling circuits further include an electric pump and a second temperature radiator, the low temperature line mounted with the electric pump and the second temperature radiator.

13. A coolant control thermoelectric generation method of controlling the coolant thermoelectric generation system as defined in claim 1, including a flow rate adjustment valve connected to the controller to adjust a coolant circulated by a pump of the engine cooling circuits and flowing to a first radiator of the engine cooling circuits and a heat exchanger and a flow path switching valve integrated in an internal space of the thermoelectric module and connected to the controller, the method comprising:
distributing, by the flow rate adjustment valve connected to the controller, the coolant circulated by the pump, to the first radiator and the heat exchanger;
adjusting, by the flow path switching valve integrated in the internal space of the thermoelectric module and connected to the controller, a flow rate of the engine coolant with the path switching to the heat exchange line, in which the heat exchange effect occurs, and the bypass line, in which no heat exchange effect occurs, when the temperature of the engine coolant is configured for the thermoelectric generation of the thermoelectric module due to the temperature difference between the temperature of the engine coolant circulating a second radiator of the power generation cooling circuits by an electric pump of the power generation cooling circuits and the coolant having the temperature lower than the temperature of the engine coolant and circulating the first radiator; and
controlling, by the controller, the flow path switching valve in one of a first thermoelectric generation operation mode of a thermoelectric generation region, a second thermoelectric generation operation mode of a thermoelectric generation/engine cooling combined region, a third thermoelectric generation operation mode of an engine cooling region, and a fourth thermoelectric generation operation mode of a thermoelectric generation/engine cooling blocking region.

14. The coolant control thermoelectric generation method of claim 13,
wherein in the first thermoelectric generation operation mode, the heat exchange effect occurs in the heat exchange line by opening a thermoelectric module side of the flow rate adjustment valve, driving the pump and the electric pump, and opening the heat exchange line and closing the bypass line by opening of the flow path switching valve, and
wherein the first thermoelectric generation operation mode is configured to apply an engine cooling demand amount equal to or less than a predetermined setting value and an engine coolant temperature target value, to the coolant thermoelectric generation system.

15. The coolant control thermoelectric generation method of claim 13,
wherein in the second thermoelectric generation operation mode, the heat exchange effect occurs in the heat exchange line by opening a thermoelectric module side of the flow rate adjustment valve, driving the pump and the electric pump, and partially opening the heat exchange line and partially opening the bypass line by the opening of the flow path switching valve, and
wherein the second thermoelectric generation operation mode is configured to apply an engine cooling demand amount equal to or more than a predetermined setting value and an engine coolant temperature target value equal to or more than a predetermined setting value, to the coolant thermoelectric generation system.

16. The coolant control thermoelectric generation method of claim 13,
wherein in the third thermoelectric generation operation mode, no heat exchange effect occurs in the heat exchange line by opening a thermoelectric module side of the flow rate adjustment valve, driving the pump, stopping the electric pump, closing the heat exchange line and opening the bypass line by opening of the flow path switching valve, and
wherein the third thermoelectric generation operation mode is configured to apply an engine cooling demand amount equal to or more than a predetermined setting value and an engine coolant temperature target value equal to or less than a predetermined setting value, to the coolant thermoelectric generation system.

17. The coolant control thermoelectric generation method of claim 13,
wherein in the fourth thermoelectric generation operation mode, no heat exchange effect occurs in the heat exchange line by closing a thermoelectric module side of the flow rate adjustment valve, stopping the pump and the electric pump, and closing the heat exchange line and closing the bypass line by the closing of the flow path switching valve, and
wherein the fourth thermoelectric generation operation mode is configured to apply an engine cooling demand amount equal to or less than a predetermined setting value and an engine coolant temperature target value equal to or less than a predetermined setting value, to the coolant thermoelectric generation system.

18. The coolant control thermoelectric generation method of claim 13,
wherein one of an engine Revolution Per Minute (RPM), an engine load, and an outside air temperature is applied as a condition of operating the flow path switching valve.

19. The coolant thermoelectric generation system of claim 1, wherein the high temperature line of the engine cooling circuits and the low temperature line of power generation cooling circuits are fluidically separated from each other.

* * * * *